Nov. 22, 1966 J. W. MOTTO, JR 3,287,576

SEMICONDUCTOR SWITCHING CIRCUIT COMPRISING SERIES-CONNECTED GATE CONTROLLED SWITCHES TO PROVIDE SLAVE CONTROL OF SWITCHES

Filed July 23, 1964

WITNESSES:

Bernard R. Giegucz

James F. Young

INVENTOR

John W. Motto, Jr.

BY

C. L. Menzemer

ATTORNEY

United States Patent Office 3,287,576

Patented Nov. 22, 1966

3,287,576

SEMICONDUCTOR SWITCHING CIRCUIT COMPRISING SERIES-CONNECTED GATE CONTROLLED SWITCHES TO PROVIDE SLAVE CONTROL OF SWITCHES

John W. Motto, Jr., Greensburg, Pa., assignor to Westinghouse Electric Corporation, Pittsburgh, Pa., a corporation of Pennsylvania Filed July 23, 1964, Ser. No. 384,686
10 Claims. (Cl. 307—88.5)

This invention relates to semiconductor switching circuitry employing gate controlled switches, and more particularly to a slave control circuit for gate controlled switches capable of controlling high voltage D.C. power, such as required in radar, sonar and many other military and industrial applications.

The Gate Controlled Switch (GCS) is a solid state semiconductor NPNP four-layer device somewhat similar to the Silicon Controlled Rectifier (SCR) in that it has all the basic features of the SCR; however, it does not lose its control after the device has been rendered conductive. The gate controlled switch can turn off the load current by applying a reverse pulse of relatively small magnitude to its gate electrode. It is somewhat similar to a switching transistor in performance, except that it does not require a continuous control current to maintain the conduction state. The gate controlled switch essentially combines the desirable features of both switching transistors and silicon controlled rectifiers. A more exhaustive treatment of both the gate controlled switch and the silicon controlled rectifier can be found in the handbook entitled Silicon Controlled Rectifier Designers Handbook, Robert Murray, Jr. (editor), published by the Westinghouse Electric Corporation, 1st Edition, 1963. Another teaching of the characteristics of the gate controlled switch is noted in U.S. Patent No. 3,210,563, issued Oct. 5, 1963, in the name of T. C. New entitled, "Semiconductor Switch Device." This application is also assigned to the assignee of the present invention.

It is an object of the present invention, therefore, to provide a gate controlled switch circuit wherein the gate controlled switches are operated in series.

It is yet another object of the present invention to provide slave control of series operated gate controlled switches.

It is still another object of the present invention to provide a switching circuit employing series connected gate controlled switches which are controlled by a slave action wherein the turn-on and turn-off of a master unit controls the turn-on and turn-off of the other series connected devices.

Briefly, the subject invention teaches a circuit which utilizes the pulse control of the gate controlled switch to control series connected devices without the use of isolating transformers. Capacitors are employed which momentarily couple turn-on pulses sequentially to series connected gate controlled switches when one gate controlled switch, called a master, is turned on and these same capacitors couple turn-off pulses to the series connected gate controlled switches when the master is switched off. By controlling the conduction state of the master gate controlled switch, a plurality of gate controlled switches connected in series to the master can be controlled so that operation at relatively high D.C. voltages can be achieved to control the flow of power to a load coupled to the series connected gate controlled switches.

Other objects and advantages of the present invention will become apparent as a study of the following detailed description of the invention proceeds when read in conjunction with a study of the drawings wherein.

Figure 1:
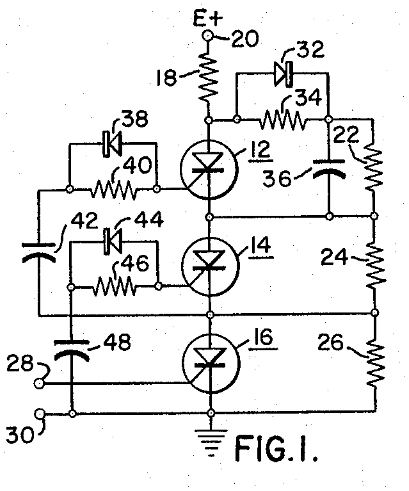
FIGURE 1 is a schematic diagram illustrative of one embodiment of the subject invention.

Referring to FIGURE 1, three gate controlled switches 12, 14 and 16, hereinafter referred to as a GCS are shown coupled together in series to a load 18. The series circuit combination is achieved by connecting the cathode electrode of GCS 12 to the anode electrode of GCS 14. The cathode of GCS 14 is then coupled to the anode electrode of GCS 16 which has its cathode electrode connected to a point of reference potential, illustrated as ground. The load 18 is connected to the anode electrode of GCS 12 while the opposite end thereof is connected to terminal 20 which is adapted to be connected to the positive terminal of a D.C. voltage from a power supply, not shown. A pair of input terminals 28 and 30 is connected to GCS 16 such that terminal 28 is connected to the gate electrode and terminal 30 is connected to the cathode returned to ground.

Coupled across the anode and cathode electrodes of GCS 12 is a circuit combination comprising a resistance 34 connected to capacitor 36. Across the resistance 34 is connected a diode 32 poled so as to allow current flow therethrough when a positive potential is applied to terminal 20. A similar circuit combination comprising resistor 40, capacitor 42 and diode 38 is coupled between the gate electrode of GCS 12 and the cathode electrode of GCS 14. Yet another similar circuit combination comprising resistor 46, capacitor 48 and diode 44 is coupled between the gate electrode of GCS 14 and the cathode electrode of GCS 16. Coupled across the three GCS's is a voltage divider network comprising resistors 22, 24 and 26 having connections so that resistor 22 is shunted across GCS 12, resistor 24 is shunted across GCS 14, and resistor 26 is shunted across GCS 16.

Representative values of the aforementioned components may be, for example:

$R34$, $R40$, and $R46$=100 ohms
$C36$, $C42$, and $C48$=.05 microfarad
$R22$, $R24$, and $R26$=300 kilohms
$R18$=500 ohms
$E+$=1000 volts D.C.

The operation of the circuit illustrated in FIGURE 1 is as follows: When the circuit is first energized by applying a positive supply voltage to terminal 20, the supply voltage will divide substantially equally across GCS 12, GCS 14, and GCS 16 due to the voltage divider action of resistors 22, 24 and 26. The voltage drop across the load resistor 18 and resistance 34 is negligible because their combined value is substantially less than the combined value of resistors 22–26. That is, combined value of 600 ohms is negligible in comparison to the voltage divider which has a value of 900,000 ohms. Capacitors 36, 42 and 48 will each charge to one-third of the supply voltage due to the voltage divider comprising resistors 22 through 26. It is immediately evident that capacitor 36 will charge to the voltage appearing across resistor 22; however, it is not immediately obvious how capacitors 42 and 48 are charged by the voltage appearing across resistors 24 and 26, respectively. Capacitors 42 and 48 are charged to one-third of the supply voltage due to the fact that there is a low impedance path across the cathode-to-gate junctions of GCS 12 and GCS 14, respectively. These capacitors then charge through the junction and diodes 38 and 44.

As previously mentioned, a gate controlled switch can be rendered conductive or non-conductive by a control pulse applied to its gate electrode. By applying a turn-on (positive) pulse to the terminals 28 and 30 from a control pulse source, not shown, GCS 16 hereinafter referred to as the master GCS, will turn on. When this happens, GCS 16 is capable of supporting current flow in either direction through the anode-to-cathode junction. Capacitor 48 will then discharge through resistor 46 and the gate electrode of GCS 14. The gate junction acts as a forward bias diode to support current flow when capacitor 48 begins to discharge and the discharging current from capacitor 48 will turn-on GCS 14 rendering it conductive. What has occurred is that the turning-on of the master GCS provides a discharge current path for capacitor 48 which in turn turns on GCS 14. As GCS 14 becomes conductive, a discharge path for capacitor 42 is closed allowing it to discharge through resistor 40 and the gate of GCS 12. This successive turn-on of the remainder of the GCS's once the master GCS is triggered acts like a "chain reaction" and occurs very rapidly.

The entire series combination of GCS 12 through GCS 16 is now fully conductive and due to its very small impedance, the supply voltage is entirely dropped across the load 18 returned substantially to ground potential.

When a turn-off (negative) pulse is applied to terminals 28 and 30, the master GCS 16 will become non-conductive and will turn-off. The turn-off of the master GCS 16 will start to block the applied voltage E+ and capacitor 48 will start to charge to the voltage across the master GCS through the cathode and gate of GCS 14. This will initiate turn-off of GCS 14. When GCS 14 turns off, capacitor 42 will charge to the voltage across GCS 14 out of the gate of GCS 12 turning GCS 12 off. This second "chain reaction" is also very rapid, and the minute delay time between units is not significant because the voltage across capacitors 36, 42 and 48 cannot change appreciably in this time. The action of the diode 32 and capacitor 36 aids in the charging of capacitor 42 in effecting turn-off of GCS 12.

What has been described therefore is a slave control of a plurality of series connected gate controlled switches which are rendered conductive and non-conductive in accordance with the controlled conductive state of a master gate controlled switch which is part of the series circuit combination.

Figure 2:
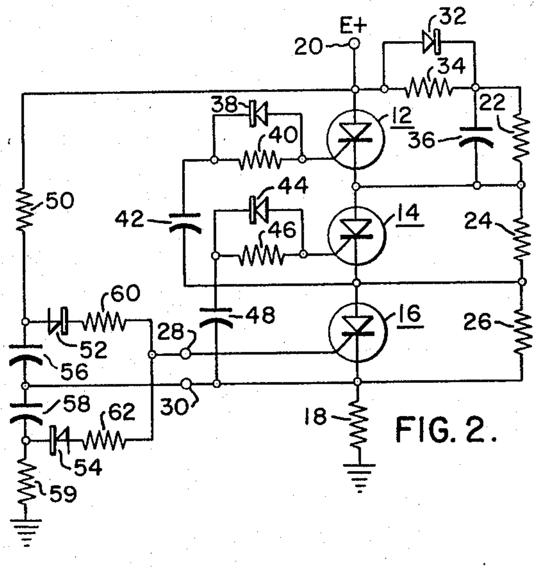
FIGURE 2 is a schematic diagram illustrative of one mode of operation in which the embodiment shown in FIGURE 1 can be utilized.

FIGURE 2 illustrates the manner in which the embodiment in FIGURE 1 can be adapted to operate as a free-running chopper circuit to alternately supply power to a load at predetermined intervals of time. The circuit shown in FIGURE 2 is in all respects exactly the same as that shown in FIGURE 1 with the exception that the load 18 has been transposed to the cathode side of GCS 16 and now applying the supply voltage E+ directly to the anode electrode of GCS 12 by a direct connection to terminal 20. In addition, the following circuitry is coupled to the terminals 28 and 30. A resistor 50 is coupled at one end to the terminal 20 while the other end is connected to a capacitor 56 which in turn is connected to a capacitor 58. The capacitor 58 is returned to ground potential through resistor 59. The common connection between capacitors 56 and 58 is connected to the terminal 30. At the common connection between resistor 50 and capacitor 56 is a four-layer breakdown diode 52 which is coupled to terminal 28 through resistor 60. Another four-layer break-down diode is connected to the common connection between capacitor 58 and resistor 59 and is also coupled to terminal 28 through resistor 62. It should be pointed out that the break-down diodes 52 and 54 are connected in opposite polarity from one another for purposes which will be hereinafter more evident.

In operation, the supply voltage E+ will divide equally across GCS 12, GCS 14 and GCS 16 due to the resistors R22, R24 and R26, respectively. Capacitors 36, 42 and 48 will charge to substantially one-third of the supply voltage E+ as described with respect to the embodiment shown in FIGURE 1.

Capacitor 56 will charge through resistors 50 and 18 to the breakdown voltage of the break-down diode 52 and discharge into the gate of the master GCS 16 through terminal 28 turning-on the master GCS 16. Capacitor 48 will then discharge through the gate of GCS 14 turning it on and a chain reaction, previously described, with respect to the embodiment shown in FIGURE 1, occurs very rapidly until all GCS's turned on and the full supply voltage E+ appears across the load 18. When GCS 12 through GCS 16 has become conductive, capacitor 58 will charge through the resistance 59 until the break-down voltage of break-down diode 54 occurs at which time capacitor 58 discharges out of the gate electrode of the master GCS 16 turning it off. When the master GCS turns-off and starts to block the applied voltage E+, capacitor 48 will again charge as before turning GCS 14 off. When GCS 14 goes off, capacitor 42 will again charge turning-off GCS 12 finally rendering the whole series combination non-conductive or "OFF." By means of the capacitors 56 and 58 discharging through the respective break-down diodes 52 and 54, turn-on and turn-off pulses are fed to the master gate controlled switch 16 thereby enabling the circuit to operate in a free-running mode.

The embodiments shown and described in FIGS. 1 and 2 utilize three gate controlled switches connected in series. This number is not meant to be considered in a limiting sense but is shown for purposes of illustration only. Any desired number of a plurality of gate controlled switches can be utilized. As a practical matter, however, circuit operability is somewhat affected as the total number of gate controlled switches is increased. This is a result of the additional blocking voltage built up on the capacitors required coupling the gate controlled switches that turn-off first in the series string, i.e. the master gate controlled switch and those adjacent to it. The capacitor connected in parallel with these first GCS's will have additional time to charge and will reach a higher voltage than units which switch off at a later time, for example, GCS 12 in FIGURE 1. The additional time will increase as the number of gate controlled switches connected in series and the blocking voltage of the gate controlled switches which turn-off first will have a tendency to become excessively high. In order to effectively overcome the voltage gradient problem existing when a large number of gate controlled switches are connected in series, the embodiment shown in FIGURE 3 reduces the voltage gradient by taking groups or modules, each containing a predetermined number of series connected, slave controlled, gate controlled switches and treats them as one composite circuit wherein all of the gate controlled switches are connected in series however operated in sections so that two slave actions take place. The primary slave drive is in the whole string of GCS's connected in series, being under the influence of the first master GCS while the second slave drive switches a respective master gate controlled switch in each of the modules. That is, the primary slave drive occurs as hereinbefore described; however, the secondary slave drive is effected by an additional master gate controlled switch within each module.

Figure 3:
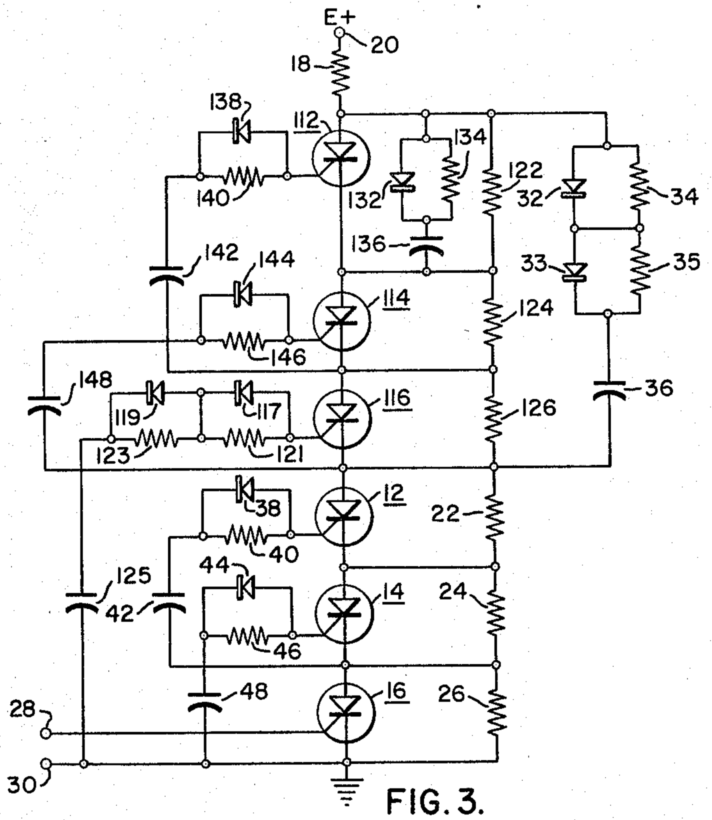
FIGURE 3 is a schematic diagram illustrative of a second embodiment of the present invention.

With respect to the embodiment shown in FIG. 3, two groups of gate controlled switches are shown. The first group comprises GCS 12, GCS 14 and GCS 16 while the second group comprises GCS 112, GCS 114 and GCS 116. The first group contains a master GCS 16 which is adapted to be coupled to terminals 28 and 30 for the reception of a control pulse from a source not shown. In all other respects, the first group is identical to the embodiment shown in FIGURE 1 with the exception that a pair of diodes 32 and 33 and a pair of resistors 34 and 35 are coupled to capacitor 36. The second group or module is similar to the first in all respects; however, the GCS 116 is effectively made a second master GCS by having its gate electrode returned to ground by means of the capacitor 125 connected to the resistor-diode combination comprising diodes 117 and 119 and resistors 121 and 123.

The operation of the embodiment shown in FIGURE 3 is identical to the embodiment shown in FIGURE 1 in its turn-on phase. By applying a turn-on pulse to the input terminal 28 turning the master GCS 16 on, the chain reaction occurs in sequence from GCS 116 through GCS 112 of the second module. As has been indicated, an improvement is desired regarding the turn-off causing substantially large voltage to be built up on the capacitors nearer the first GCS to turn-off. Regarding the circuit shown in FIGURE 3, when a turn-off pulse is applied to terminal 28 rendering master GCS 16 non-conductive, a rate of rise of voltage occurs at the anode electrode of master GCS 16. As GCS 14 and GCS 12 are in the conducting state, this DV/DT also occurs at the gate of GCS 116, the second master GCS of the second group of module. Because capacitance 125 is connected to the same point as capacitor 48, the second master GCS responds in a manner to GCS 114 so that it turns-off at approximately the same time as GCS 14 of the first group; however, GCS 16 is a master GCS of its respective module which in turn will further initiate cut-off of the other GCS's under its control. In effect, the second module starts to turn-off only one turn-off time later than the start of the first module.

By operating a large number of series controlled switches in a manner described with respect to FIGURE 3, considerable improvement is achieved. It should also be pointed out that with respect to the embodiment shown in FIGURE 1 the operation of a large number of GCS's can be utilized with capacitance gradient techniques, that is, using larger voltage ratings for the units closest to the master gate controlled switch. It should also be pointed out that this technique can also be utilized with the embodiment shown in FIG. 3 to further enhance its operability.

While there has been shown and described what is at present considered to be the preferred embodiments of the present invention, modifications will readily occur to those skilled in the art. It is not desired, therefore, that the invention be limited to those specific arrangements shown and described, but it is to be understood that all equivalents, alterations, and modifications within the spirit and scope of the present invention are herein meant to be included.

I claim as my invention:

1. An electrical circuit adapted to be operated from a source of supply voltage comprising in combination: a plurality of gate controlled switches capable of being turned on and off by a control pulse of positive and negative polarity, respectively, each said plurality of gate controlled switches having a gate, an anode and a cathode electrode; means for coupling all said plurality of gate controlled switches together in a series circuit; a load impedance coupled to said series circuit; circuit means coupling said load impedance and said series circuit across said source of supply voltage; a pair of input terminal means coupled to the gate electrode of one of said plurality of gate controlled switches for applying a control pulse thereto; a capacitor charging circuit coupled to the gate electrode of all other said plurality of gate controlled switches and being selectively coupled to an adjacent switch of said plurality of switches for charging to substantially a predetermined fraction of the magnitude of said source of supply voltage; a capacitive discharge circuit coupling said all other gate controlled switches for discharging in succession rendering each of said plurality of gate controlled switches conductive in succession beginning from said one switch upon having been triggered on by a positive pulse applied to said pair of input terminals, said charging circuit being adapted to successively turn-off all other said plurality of gate controlled switches when said one switch is turned off by a negative pulse applied to said pair of input terminals.

2. An electrical circuit adapted to be powered from a source of supply voltage of a predetermined magnitude comprising in combination: a load circuit; a plurality of gate controlled switches, each having a gate, an anode and a cathode, means coupling said plurality of gate controlled switches together in series circuit combination to said load circuit across said source of supply voltage; a pair of input terminals coupled across the gate and cathode of a master gate controlled switch of said plurality of gate controlled switches for applying positive and negative control pulses to said gate in order to turn said master gate controlled switch on and off respectively; a voltage divider network coupled across all said plurality of gate controlled switches for selectively impressing substantially a fractional part of said source of supply voltage thereacross; a charging and a discharging circuit coupled to the gate of all other of said plurality of gate controlled switches for successively turning on said all other gate controlled switches in sequence upon a positive control pulse being applied to the gate electrode of said master controlled switch from said pair of input terminals and for successively turning off said plurality of gate controlled switches upon a negative control pulse being applied to said gate of said master gate controlled switch.

3. A slave controlled series connected circuit utilizing gate controlled switches powered from a source of supply voltage comprising in combination: a plurality of gate controlled switches, each having a gate, an anode and a cathode; means coupling the respective anode and cathode electrode of said plurality of gate controlled switches in a series circuit combination; load means coupled to said series circuit combination across said source of supply voltage; a resistive voltage divider network coupled across said series circuit combination, providing a substantially equal predetermined voltage across the anode and cathode electrodes of each of said plurality of gate controlled switches; a pair of input terminals coupled to the gate electrode of a master gate controlled switch of said plurality of gate controlled rectifiers for receiving a control pulse of predetermined polarity for selectively rendering said master gate controlled switch both conductive and non-conductive; a charging circuit coupled to the gate electrode of all other of said plurality of gate controlled switches, being operable to charge to a predetermined voltage through the gate and cathode electrode of its respective gate controlled switch from said voltage divider network; a discharge circuit coupled to the gate electrode of said all other of said plurality of gate controlled switches, being operable to render said all other of said plurality of gate controlled switches conductive in sequence once said master gate controlled switch is rendered conductive by a control pulse applied to said input terminals, and wherein said all other gate controlled switches are rendered non-conductive in sequence once a control pulse of opposite polarity is applied to said master gate controlled switch.

4. Electrical apparatus as defined by claim 3 wherein said charging circuit comprises a capacitor and a diode connected in series.

5. Apparatus as defined by claim 3 wherein said discharging circuit comprises a capacitor and a resistor connected in series.

6. An electronic circuit comprising in combination: a plurality of gate controlled switches, each having a gate, an anode and a cathode electrode, said plurality of gate controlled switches being coupled together in series by means of an anode-to-cathode electrode connection, with a terminating gate controlled switch being defined as a master gate controlled switch; a load means coupled to said plurality of gate controlled switches; a voltage divider network coupled across said plurality of gate controlled switches for applying a predetermined voltage across each said plurality of gate controlled switches; a capacitor circuit coupled to the gate electrode of all gate controlled switches exclusive of said master gate controlled switch for momentarily coupling turn-on pulses to said plurality of gate controlled switches when said master gate controlled switch is turned on and which also couples turn-off pulses to said plurality of gate controlled switches when said master controlled switch is switched off; and regenerative circuit means coupled to the gate electrode of said master gate controlled switch for alternately applying a pulse for turning said master gate controlled switch on and off periodically.

7. A circuit as defined by claim 6 wherein said regenerative circuit coupled to the gate electrode of said master gate controlled switch comprises a first capacitor and a first break-down diode for coupling a turn-on signal to said gate electrode of said master gate controlled switch upon said first capacitor charging to the break-down level of said first break-down diode, and a second capacitor and a second break-down diode coupled to said gate electrode of said master gate controlled switch and coupled to said load means for charging said second capacitor by a voltage developed across said load means during a period when all said plurality of gate controlled switches are turned on, said second break-down diode coupling a turn-off pulse to said gate electrode of said master gate controlled switch upon the charge developed across said second capacitor reaching the break-down level of said second break-down diode.

8. A regenerative circuit as defined in claim 7, wherein said first and said second break-down diode comprise a four-layer semiconductor break-down diode.

9. An electrical circuit utilizing gate controlled switches comprising in combination: a load; a plurality of groups of gate controlled switches connected in series to said load means across a source of supply voltage, each said plurality of groups comprising a plurality of series connected gate controlled switches having a gate electrode, an anode electrode, and a cathode electrode, said plurality of gate controlled switches being connected in series by means of a cathode-to-anode electrode connection, with one of said plurality of gate controlled switches adapted to operate as a master gate controlled switch, all other of said plurality of gate controlled switches being capacitively coupled via respective gate electrodes to sequentially turn-on and turn-off its respective gate controlled switch upon said master gate controlled switch being turned on and turned off; input means coupled to the gate electrode of the master gate controlled switch of a first group of said plurality of groups for initiating a sequential turn-on and turn-off of all said gate controlled switches of said plurality of groups by means of a gate pulse of a predetermined polarity applied thereto, and capacitor means coupling said master gate controlled switch of all other said groups to the master gate controlled switch of said first group for enhancing turn-on and turn-off of the master gate controlled switch of a respective group.

10. An electrical circuit comprising in combination: a plurality of series connected gate controlled switches operated as a plurality of modules of gate controlled switches and wherein each said plurality of modules contains one gate controlled switch which is adapted to operate as a respective master gate controlled switch, all other gate controlled switches in each said plurality of modules of gate controlled switches having capacitive coupling therebetween for being responsive to the conductive state of said respective master gate controlled switch and its adjacent gate controlled switch, being rendered conductive or nonconductive in accordance with the conductive state of said respective master gate controlled switch, each module of said plurality of modules additionally having a capacitive coupling to the master gate controlled switch of a first module of said plurality of modules, for being rendered in the same conductive state as the master gate controlled switch of said first module; and a pair of input terminals coupled to the gate electrode of the first master gate controlled switch of said first group for applying a control pulse thereto.

References Cited by the Examiner

UNITED STATES PATENTS

| | | | |
|---|---|---|---|
| 2,835,829 | 5/1958 | Sourgens et al. | 307—88.5 |
| 3,007,061 | 10/1961 | Gindi | 307—88.5 |
| 3,095,510 | 6/1963 | Lane | 307—88.5 |
| 3,226,625 | 12/1965 | Diebold | 307—88.5 X |

ARTHUR GAUSS, *Primary Examiner.*

S. D. MILLER, *Assistant Examiner.*